US012739989B2

(12) United States Patent
Tsorng et al.

(10) Patent No.: US 12,739,989 B2
(45) Date of Patent: Sep. 15, 2026

(54) ADJUSTABLE BRACKET FOR POWER SUPPLY UNIT AND TELECOMMUNICATIONS SYSTEM INCLUDING THE SAME

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Wei-Kang Tsai, Taoyuan City (TW); You-Sheng Yen, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 153 days.

(21) Appl. No.: 18/767,118

(22) Filed: Jul. 9, 2024

(65) Prior Publication Data

US 2026/0020174 A1 Jan. 15, 2026

(51) Int. Cl.

| | |
|---|---|
| ***H05K 5/02*** | (2006.01) |
| ***H04B 1/03*** | (2006.01) |
| ***H04B 1/08*** | (2006.01) |

(52) U.S. Cl.
CPC ............... *H05K 5/023* (2013.01); *H04B 1/03* (2013.01); *H04B 1/08* (2013.01)

(58) Field of Classification Search
CPC . G06F 1/26; G06F 1/183; G06F 1/188; G06F 1/185; H05K 5/023; H05K 7/1402; H05K 7/1461; H05K 7/14; H04B 1/03; H04B 1/08; F16M 13/022
See application file for complete search history.

(56) References Cited

U.S. PATENT DOCUMENTS 10,244,649 B2 * 3/2019 Anderson, III ...... H05K 5/0226
11,163,343 B1 * 11/2021 Lin ......................... G06F 1/188
2013/0107441 A1 * 5/2013 Zhou ....................... G06F 1/185 248/298.1
2016/0291308 A1 * 10/2016 Sink ....................... G02B 21/26
2022/0117111 A1 * 4/2022 Tseng ...................... G06F 1/186
2023/0309253 A1 * 9/2023 Ho ..................... H05K 7/14325

* cited by examiner

*Primary Examiner* — Sagar Shrestha
*Assistant Examiner* — Peter Krim
(74) *Attorney, Agent, or Firm* — Nixon Peabody LLP

(57) ABSTRACT

An adjustable bracket configured to enclose a power supply unit is disclosed. The adjustable bracket includes a board bracket, a movable part coupled to the board bracket, a fixed part, and a handle fixedly coupled to the movable part. The fixed part has a first slit that is generally parallel to a second slit. The handle includes an upper part, a first protrusion, and a second protrusion. The first protrusion extends from a first end of the upper part, and the second protrusion extends from a second end of the upper part. The first protrusion is inserted through the first slit, and the second protrusion is inserted through the second slit. The movable part is movably coupled to the fixed part via the handle. The adjustable bracket is placed in one of a plurality of configurations. In response to pressing the upper part of the handle, the movable part is movable.

29 Claims, 9 Drawing Sheets

102
109
203
111
A
201
103
C
119
107
105

ADJUSTABLE BRACKET FOR POWER SUPPLY UNIT AND TELECOMMUNICATIONS SYSTEM INCLUDING THE SAME

FIELD OF THE INVENTION

The present invention relates generally to a bracket for a power supply unit, and more specifically, to an adjustable bracket that can be size-adjusted according to a dimension of the power supply unit mounted in a chassis of electronic equipment.

BACKGROUND OF THE INVENTION

In general, telecommunications systems, such as server devices or computer systems, have a chassis for housing electronic devices such as a power supply unit (PSU). PSUs are available in various sizes. In particular, there are variations in the length of PSUs available in the market. However, server chassis are not available in various sizes to accommodate differently-sized PSUs. Thus, it may be difficult to accommodate certain PSUs in a chassis in which PSUs are housed. For that reason, modified tooling or customized tool fabrication may need to be designed according to the requirements of the chassis. Such modifications or customizations of the chassis may be too costly when a specific type of PSU needs to be installed in the chassis. Designing newly-sized chassis to accommodate the specific type of PSU may also complicate inventory management.

Therefore, a need exists for an adjustable bracket that allows for the installation of a PSU in a chassis, regardless of its dimension and/or shape, without requiring modification of the chassis. A need also exists for a mechanism that allows for the easy installation of a PSU in the chassis that houses electronic equipment.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional way of mounting various sizes of PSUs in a chassis of electronic equipment that may require modifications or customizations of the chassis, the present application discloses an adjustable bracket enclosing the PSU for mounting in the chassis without requiring any modifications or customizations of the chassis.

According to certain aspects of the present disclosure, a telecommunications system for electronic devices is disclosed. According to various embodiments, the telecommunications system includes a chassis for housing the electronic devices. The electronic devices include a power supply unit (PSU). The telecommunications system further includes an adjustable bracket configured to enclose the PSU and mounted within the chassis. According to various embodiments, the adjustable bracket includes a board bracket, a movable part coupled to the board bracket, a fixed part, and a handle fixedly coupled to the movable part. A power distribution board is mounted on the board bracket. The fixed part has a first slit that is generally parallel to a second slit. The handle includes an upper part, a first protrusion, and a second protrusion. The first protrusion extends from a first end of the upper part. The second protrusion extends from a second end of the upper part. The first protrusion is inserted through the first slit, and the second protrusion is inserted through the second slit. The movable part is movably coupled to the fixed part via the handle. A distance between the handle and one end of the fixed part is adjustable according to a size of the PSU. The size is different for a first PSU than for a second PSU. In response to pressing the upper part of the handle, the movable part is movable in a first direction or a second direction with respect to the fixed part.

In various embodiments, in response to pressing the upper part vertically, the movable part is allowed to move horizontally in the first or the second direction. The second direction is opposite the first direction.

In various embodiments, the adjustable bracket further includes a connector configured to receive a connection interface of the PSU. The connector is positioned on the power distribution board.

In various embodiments, each of the movable part and the fixed part has a top panel and two parallel side panels that extend from side ends of the top panel. The two parallel side panels are generally perpendicular to the top panel. An internal space is formed to receive the PSU. The internal space is between the parallel side panels of the movable part and the parallel side panels of the fixed part.

In various embodiments, the upper part of the handle is located in a raised vertical position relative to the first protrusion and the second protrusion. The first protrusion and the second protrusion are generally leveled along a lower vertical position.

In various embodiments, the handle further includes a lower part. A first end portion of the lower part is coupled to the first protrusion, and a second end portion of the lower part is coupled to the second protrusion.

In various embodiments, the lower part is fixedly coupled to the movable part.

In various embodiments, the lower part is coupled to the movable part by a fastener. The fastener passes through a hole formed at a middle portion of the lower part.

In various embodiments, the fixed part further has a third slit that is generally parallel to the first slit and the second slit. The third slit is formed between the first and second slits.

In various embodiments, the fastener is configured to move along the third slit when the movable part is moved in the first or second direction.

In various embodiments, the upper part is exposed by being placed over an outer side of the fixed part. The lower part is placed under an inner side of the fixed part.

In various embodiments, the adjustable bracket has a stopping mechanism to place the adjustable bracket in a compact configuration, in a fully extended configuration, or in an intermediately extended configuration.

In various embodiments, the fixed part has an outer side on which the upper part of the handle is exposed. The fixed part further has an inner side facing an inner space of the adjustable bracket.

In various embodiments, the stopping mechanism includes a first pair of stoppers formed on the inner side of the fixed part. One stopper of the first pair of stoppers is formed along a length direction of the first slit. Another stopper of the first pair of stoppers is formed along a length direction of the second slit.

In various embodiments, the first and second slits are obscured by portions of the first pair of stoppers protruding inward with respect to the first and second slits, respectively. The protruding is relative to a view from the inner space of the adjustable bracket toward the inner side of the fixed part. First stop areas are formed between first ends of the first pair of stoppers and first ends of the first and second slits.

In various embodiments, the stopping mechanism further includes a second pair of stoppers formed on the inner side of the fixed part. One stopper of the second pair of stoppers is formed along a length direction of the first slit. Another stopper of the second pair of stoppers is formed along a length direction of the second slit.

In various embodiments, the first and second slits are obscured by portions of the second pair of stoppers protruding inward with respect to the first and second slits, respectively. The protruding is relative to a view from the inner space of the adjustable bracket toward the inner side of the fixed part. Second stop areas are formed between second ends of the first pair of stoppers and first ends of the second pair of stoppers.

In various embodiments, the stopping mechanism further includes a third pair of stoppers formed on the inner side of the fixed part. One stopper of the third pair of stoppers is formed along a length direction of the first slit. Another stopper of the second pair of stoppers is formed along a length direction of the second slit.

In various embodiments, the first and second slits are obscured by portions of the third pair of stoppers protruding inward with respect to the first and second slits, respectively. The protruding is relative to a view from the inner space of the adjustable bracket toward the inner side of the fixed part. Third stop areas are formed between second ends of the second pair of stoppers and first ends of the third pair of stoppers.

In various embodiments, each of the first and second protrusions is insertable into a corresponding one of the first, second, and third stop areas to place the adjustable bracket in the compact configuration, in the intermediately extended configuration, or in the fully extended configuration, respectively. The first and second protrusions engage with the first, second, or third stop areas, respectively.

In various embodiments, the first PSU is receivable by the adjustable bracket in the compact configuration. The second PSU is receivable by the adjustable bracket in the fully extended configuration. The first PSU is smaller than the second PSU. A third PSU is receivable by the adjustable bracket in the intermediately extended configuration. The third PSU is smaller than the second PSU and larger than the first PSU.

In various embodiments, lengths of the first pair of stoppers are greater than lengths of the second pair of stoppers. Lengths of the first pair of stoppers are greater than lengths of the third pair of stoppers. Lengths of the third pair of stoppers are greater than lengths of the second pair of stoppers.

According to other aspects of the present disclosure, an adjustable bracket is disclosed. The adjustable bracket is configured to enclose a power supply unit (PSU) for mounting within a chassis of an electronic equipment. According to various embodiments, the adjustable bracket includes a board bracket, a movable part coupled to the board bracket, a fixed part, and a handle fixedly coupled to the movable part. A power distribution board is mounted on the board bracket. The fixed part has a first slit that is generally parallel to a second slit. The handle includes an upper part, a first protrusion, and a second protrusion. The first protrusion extends from a first end of the upper part and the second protrusion extends from a second end of the upper part. The first protrusion is inserted through the first slit. The second protrusion is inserted through the second slit. The movable part is movably coupled to the fixed part via the handle. The adjustable bracket is adjustable to be placed in a compact configuration, in a fully extended configuration, or in an intermediately extended configuration. In response to pressing the upper part of the handle, the movable part is movable in a first direction or a second direction with respect to the fixed part.

According to various embodiments, the adjustable bracket has a stopping mechanism to place the adjustable bracket in the compact configuration, in the fully extended configuration, or in the intermediately extended configuration.

According to various embodiments, the stopping mechanism includes a first pair of stoppers, a second pair of stoppers, and a third pair of stoppers formed on an inner side of the fixed part. One stopper of each of the first, second, and third pairs of stoppers is formed along a length direction of the first slit. Another stopper of each of the first, second, and third pairs of stoppers is formed along a length direction of the second slit.

According to various embodiments, portions of the first and second slits are obscured by portions of each of the first, second, and third pairs of stoppers protruding inward with respect to the first and second slits, respectively. The protruding is relative to a view from an inner space of the adjustable bracket toward the inner side of the fixed part.

According to various embodiments, first stop areas are formed between first ends of the first pair of stoppers and first ends of the first and second slits. Second stop areas are formed between second ends of the first pair of stoppers and first ends of the second pair of stoppers. Third stop areas are formed between second ends of the second pair of stoppers and first ends of the third pair of stoppers.

According to various embodiments, each of the first and second protrusions is insertable into a corresponding one of the first, second, and third stop areas to place the adjustable bracket in the compact configuration, in the intermediately extended configuration, or in the fully extended configuration, respectively. The first and second protrusions engage with the first, second, or third stop areas, respectively to place the adjustable bracket in the compact configuration, in the intermediately extended configuration, or in the fully extended configuration, respectively.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
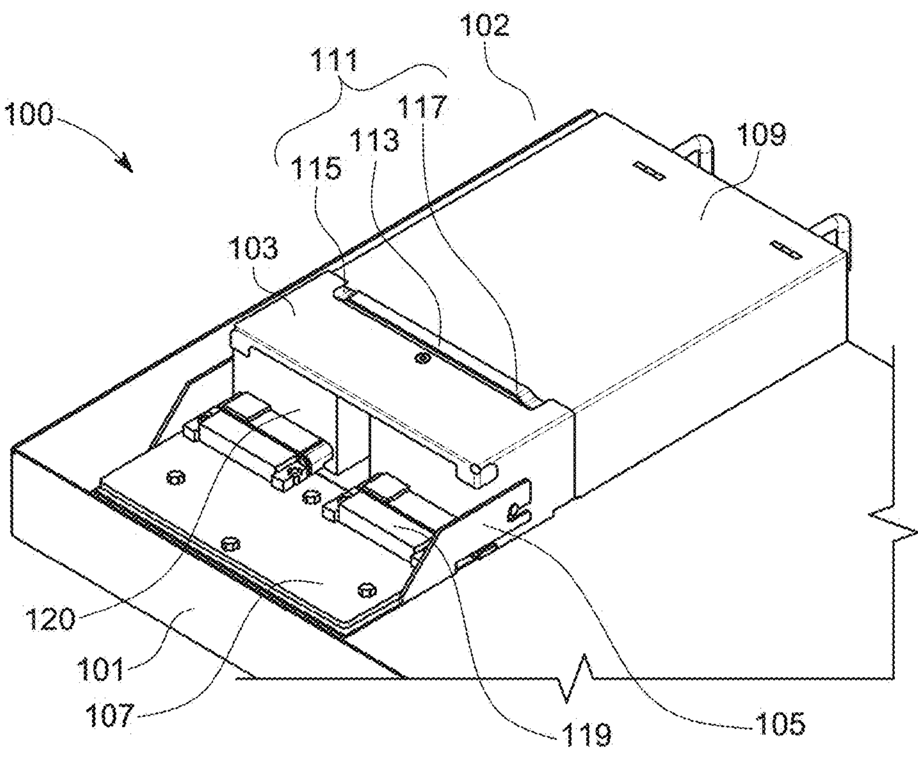
FIG. 1 is a perspective view of a portion of a telecommunications system including an adjustable bracket, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a portion of a telecommunications system 100 includes a chassis 101, according to various embodiments of the present disclosure. An adjustable bracket 102 is configured to enclose a power supply unit (PSU) 120 that is mounted within the chassis 101. The adjustable bracket 102 includes a movable part 103 coupled to a board bracket 105. A power distribution board 107 is mounted on the board bracket 105. The adjustable bracket 102 further includes a fixed part 109 and a handle 111 fixedly coupled to the movable part 103. The handle 111 includes an upper part 113 having a first end 115 and a second end 117. The adjustable bracket 102 further includes a connector 119 configured to receive a connection interface of the PSU 120. The connector 119 is positioned on the power distribution board 107.

The movable part 103 and the fixed part 109 each have a top panel and two parallel side panels that extend from side ends of the top panel. The two parallel side panels are generally perpendicular to the top panel. Thus, an internal space is formed to receive the PSU 200. The internal space is between the parallel side panels of the movable part 103 and the parallel side panels of the fixed part 109. For example, FIGS. 3A, 4A, 5A, 6A, and 7A show an internal space for receiving a PSU 120.

The movable part 103 is movably coupled to the fixed part 109 via the handle 111. Thus, a distance between the handle 111 and one end of the fixed part 109 is adjustable according to a size of the PSU 120. That is, the size is different for a first PSU than for a second PSU. The distance between the handle 111 and the one end of the fixed part 109 is adjustable, i.e., increased or decreased, to receive the first PSU or the second PSU.

In response to pressing the upper part 113 of the handle 111, the movable part 103 is movable in a first direction or a second direction with respect to the fixed part 109. The first direction is an opposite direction of the second direction. Further, in response to pressing the upper part 113 vertically, the movable part 103 is allowed to move horizontally in the first or the second direction.

Figure 2:
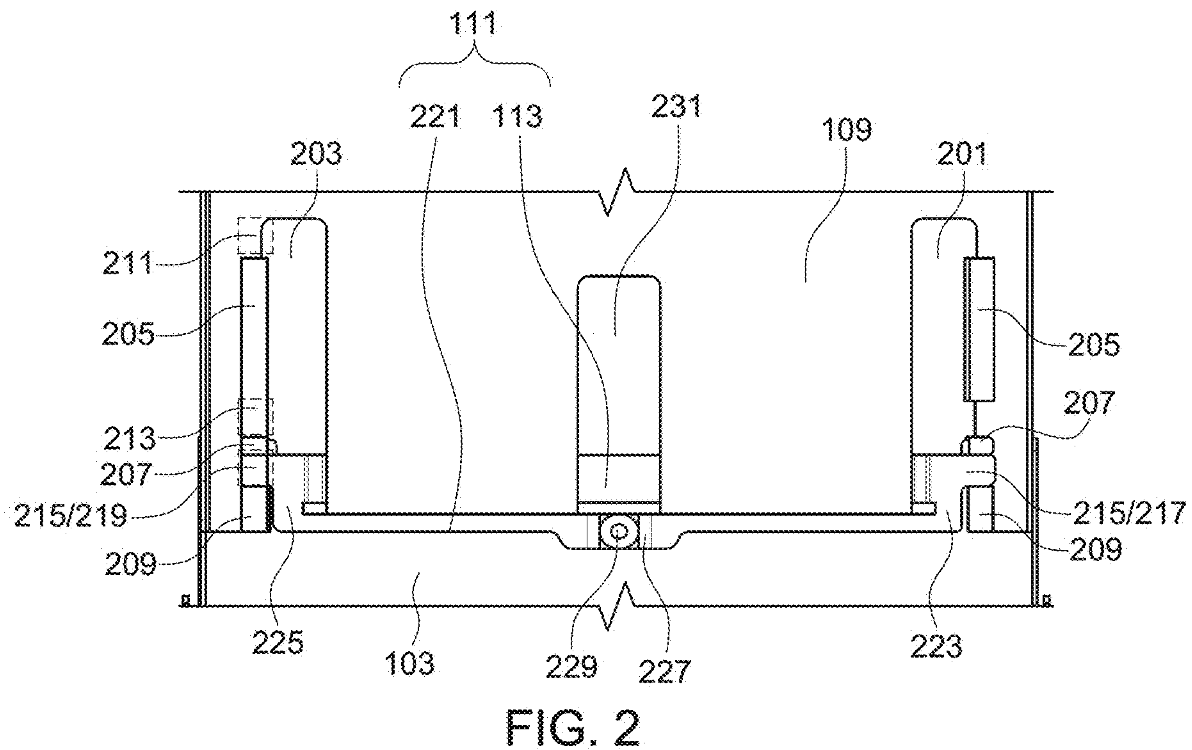
FIG. 2 is a bottom view of a portion of an adjustable bracket, according to certain aspects of the present disclosure.

FIG. 2 shows the movable part 103, fixed part 109, and handle 111, according to various embodiments of the present disclosure. While FIG. 1 shows an outer side of the fixed part 109, FIG. 2 shows an inner side of the fixed part 109. The inner side is an opposite side of the outer side. The upper part 113 of the handle 111 is exposed on the outer side of the fixed part 109, as shown in FIG. 1. The fixed part 109 has a first slit 201 that is generally parallel to a second slit 203. Sizes of the first slit 201 and the second slit 203 are generally the same. No slits are shown in FIG. 1 because the configurations of the adjustable bracket 102 are different between FIG. 1 and FIG. 2.

A stopping mechanism is provided on the inner side of the fixed part 109 to place the adjustable bracket 102 in a plurality of configurations. The size or length of the adjustable bracket 102 is different when the adjustable bracket 102 is in a different configuration. For example, the stopping mechanism is used to provide 2, 3, 4, or more configurations. Although three different configurations (i.e., a compact configuration, a fully extended configuration, and an intermediately extended configuration) are provided for the adjustable bracket 102 throughout the examples described in the present disclosure, the number of configurations is not limited to three.

Further referring to FIG. 2, the stopping mechanism includes a first pair of stoppers 205, a second pair of stoppers 207, and a third pair of stoppers 209 formed symmetrically on the inner side of the fixed part 109. Each of the first pair of stoppers 205, second pair of stoppers 207, and third pair of stoppers 209 is formed along a length direction of the first slit 201 or the second slit 203. According to various embodiments of the present disclosure, each of the first stopper 205, second stopper 207, and third stopper 209 has a different length. For example, the length of the first stopper 205 is the longest, and the third stopper 209 is longer than the second stopper 207. According to various embodiments of the present disclosure, each of the first stopper 205, second stopper 207, and third stopper 209 has the same width. The first slit 201 and the second slit 203 are at least partially obscured by portions of the first pair of stoppers 205, second pair of stoppers 207, and third pair of stoppers 209 protruding inward with respect to the first and second slits 201, 203, respectively. The protruding is relative to a view from the inner space of the adjustable bracket 102 toward the inner side of the fixed part 109.

Further referring to FIG. 2, first stop areas 211 are formed (one along the first slit 201 and the other along the second slit 203) between first ends of the first pair of stoppers 205 and first ends of the first and second slits 201, 203. Second stop areas 213 are formed (one along the first slit 201 and the other along the second slit 203) between second ends of the first pair of stoppers 205 and first ends of the second pair of stoppers 207. Third stop areas 215 are formed between second ends of the second pair of stoppers 207 and first ends of the third pair of stoppers 209. The handle 111, which moves when the movable part 103 moves, is configured to engage with one of the first stop areas 211, second stop areas 213, and third stop areas 215 to place the adjustable bracket 102 in the compact configuration, in the intermediately extended configuration, or in the fully extended configuration.

Further referring to FIGS. 1 and 2, the handle 111 includes an upper part 113, a first protrusion 217, and a second protrusion 219. Since the first and second protrusions 217, 219 are engaged with a corresponding third stop area 215 in FIG. 2, the third stop areas 215 are obscured by the respectively engaged protrusions 217, 219, and thus, are not actually shown in the drawing. The first protrusion 217 extends from a first end 115 of the upper part 113, and the second protrusion 219 extends from a second end 117 of the upper part 113. The first protrusion 217 is inserted through the first slit 201, and the second protrusion 219 is inserted through the second slit 203. The upper part 113 of the handle 111 is located in a raised vertical position relative to the first protrusion 217 and the second protrusion 219. The first protrusion 217 and the second protrusion 219 are generally leveled along a lower vertical position.

The handle 111 further includes a lower part 221. While the upper part 113 is exposed by being placed over the outer side of the fixed part 109, the lower part 221 is placed under the inner side of the fixed part 109. A first end portion 223 of the lower part 221 is connected to the first protrusion 217, and a second end portion 225 of the lower part 221 is connected to the second protrusion 219. Each of the first and second protrusions 217, 219 is insertable into a corresponding one of the first, second, and third stop areas 211, 213, 215 to place the adjustable bracket 102 in the compact configuration, in the intermediately extended configuration, or in the fully extended configuration, respectively. In this case, the first and second protrusions 217, 219 engage with the first, second, or third stop areas 211, 213, 215, respectively. The lower part 221 is coupled to the movable part 103 by a fastener 229. The fastener 229 passes through a hole formed at a middle portion 227 of the lower part 221. For example, the fastener 229 is a screw or rivet. In various embodiments of the present disclosure, the upper part 113 is generally parallel to the lower part 221. However, the upper part 113 and the lower part 221 do not overlap.

Further referring to FIG. 2, the fixed part 109 further includes a third slit 231 that is generally parallel to the first slit 201 and the second slit 203. The third slit 231 is formed between the first and second slits 201, 203. In certain embodiments, the length of the third slit 231 is shorter than the length of the first and second slits 201, 203. A view from the inner space of the adjustable bracket 102 toward the inner side of the fixed part 109 includes a portion of the upper part 113 of the handle 111 shown through the third slit 231. The view from the inner space of the adjustable bracket 102 toward the inner side of the fixed part 109 further includes the first and second protrusions 217, 219 inserted through the first and second slits 201, 203, respectively. The fastener 229 is configured to move along the third slit 231 when the movable part 103 is moved in the first or second direction.

Figure 3A:
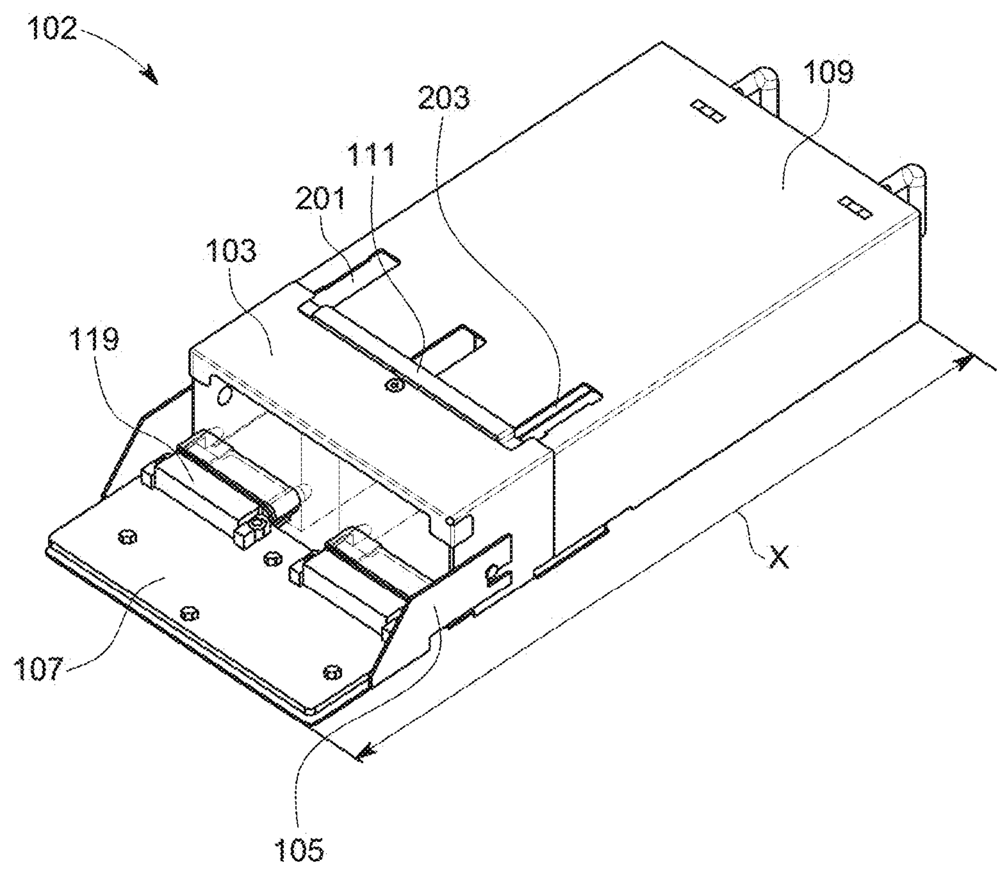
FIG. 3A is a perspective view of an adjustable bracket in a fully extended configuration, according to certain aspects of the present disclosure.
Figure 3B:
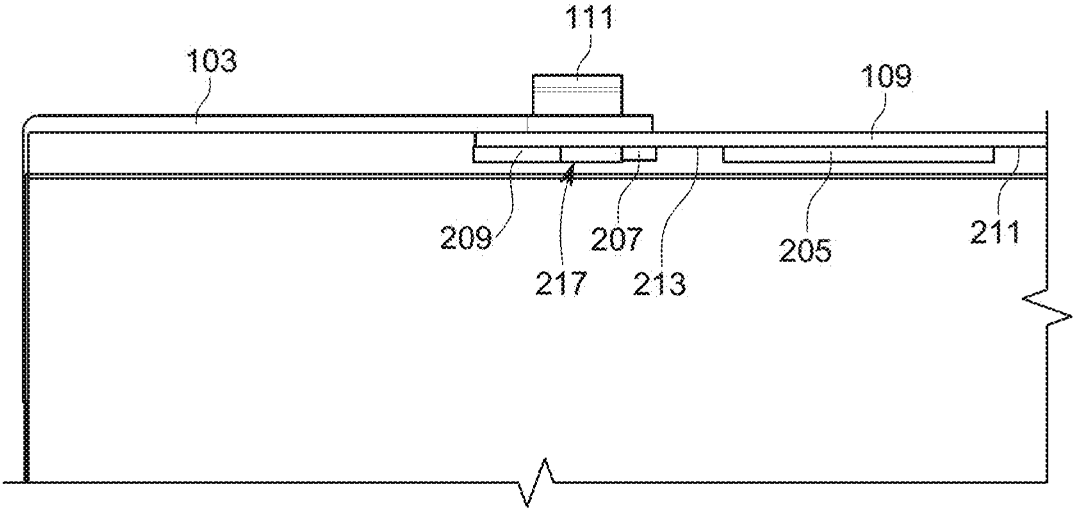
FIG. 3B is a left section view of the adjustable bracket shown in FIG. 3A, according to certain aspects of the present disclosure.
Figures 3C, 4A:
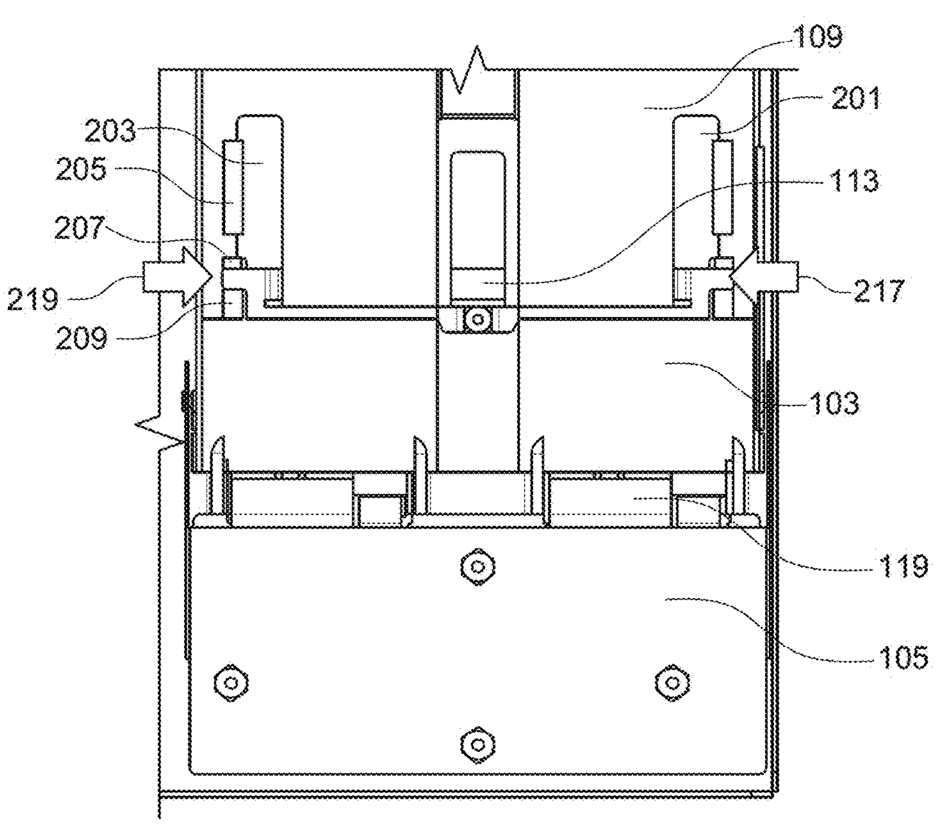
FIG. 3C is a bottom view of the adjustable bracket shown in FIG. 3A, according to certain aspects of the present disclosure.
FIG. 4A is a perspective view of an adjustable bracket showing how to transition from a fully extended configuration to an intermediately extended configuration, according to certain aspects of the present disclosure.

FIGS. 3A, 3B, and 3C show an adjustable bracket 102 in a fully extended configuration, according to certain aspects of the present disclosure. Referring to FIG. 3A, the length of the adjustable bracket 102 in the fully extended configuration is X. In FIG. 3A, the empty internal space is formed between the parallel side panels of the movable part 103 and the parallel side panels of the fixed part 109 to receive a PSU 120 is shown.

Referring to FIGS. 3B and 3C, the first and second protrusions 217, 219 of the handle 111 indicated by arrows engage with the third stop areas 215 by being positioned or locked between the second and third stoppers 207, 209. Thus, the adjustable bracket 102 is in the fully extended configuration and configured to receive a first-sized PSU 120. The first-sized PSU 120 can be coupled to the power distribution board 107 by being plugged to the connector 119.

Figure 4B:
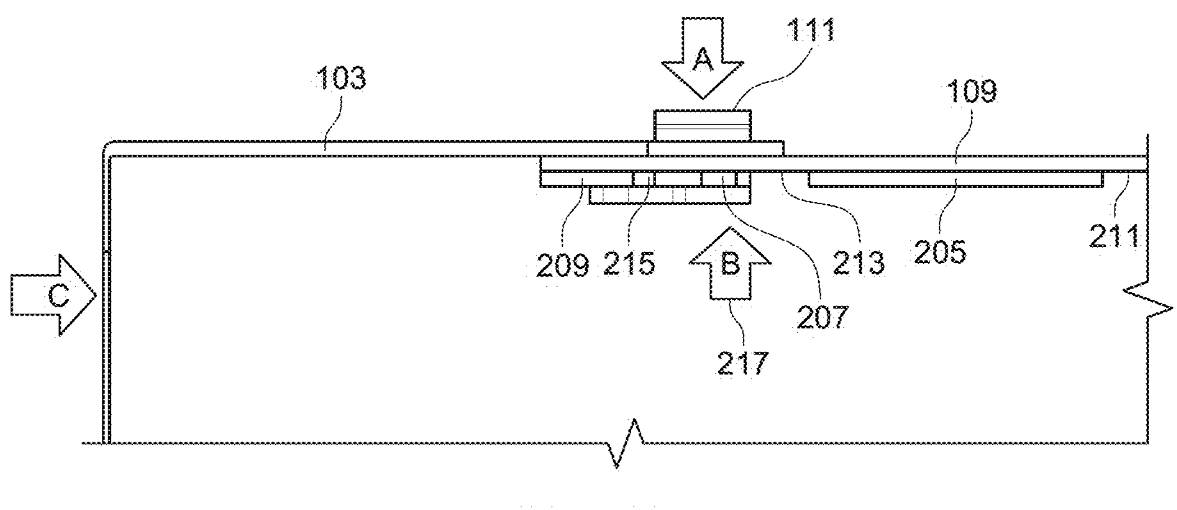
FIG. 4B is a left section view of the adjustable bracket shown in FIG. 4A, according to certain aspects of the present disclosure.
Figure 4C:
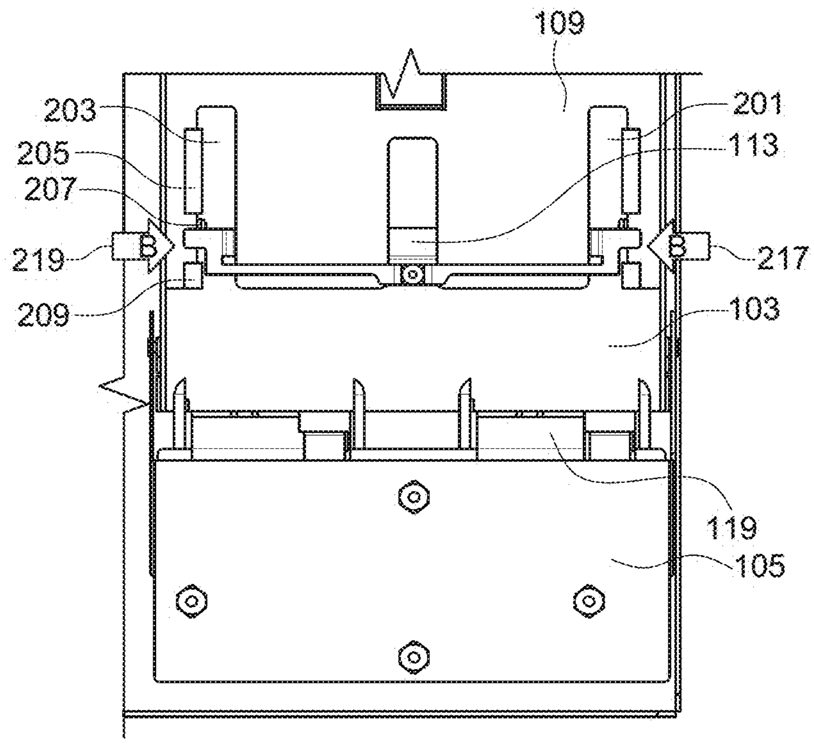
FIG. 4C is a bottom view of the adjustable bracket shown in FIG. 4A, according to certain aspects of the present disclosure.

FIGS. 4A, 4B, and 4C illustrate how to transition an adjustable bracket 102 in a fully extended configuration to an intermediately extended configuration, according to certain aspects of the present disclosure. Thus, the length X of the adjustable bracket 102 in the fully extended configuration will be reduced by the transitioning. Referring to FIGS. 4A, 4B, and 4C, in order to initiate the transitioning, the handle 111 or the upper part 113 is pressed down vertically or in the direction of arrow A. In response to pressing the handle 111 or the upper part 113, the first and second protrusions 217, 219 of the handle 111 are lowered than the stoppers 205, 207, 209. In particular, the first and second protrusions 217, 219 are positioned below the second stoppers 207, as indicated by arrow B. Subsequently, the movable part 103 is pushed horizontally in the direction of arrow C. In response to pushing the movable part 103, the handle 111 also moves horizontally, and the first and second protrusions 217, 219 will be eventually positioned at the second stop areas 213.

Figure 5A:
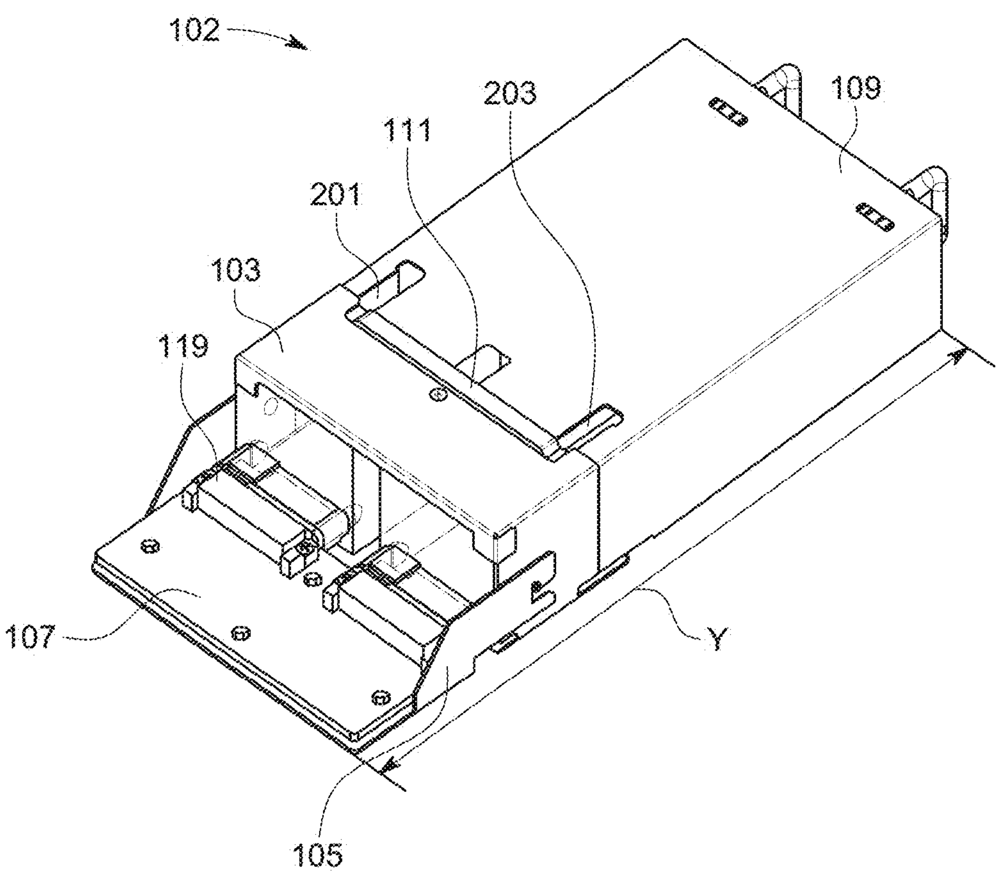
FIG. 5A is a perspective view of an adjustable bracket in an intermediately extended configuration, according to certain aspects of the present disclosure.
Figure 5B:
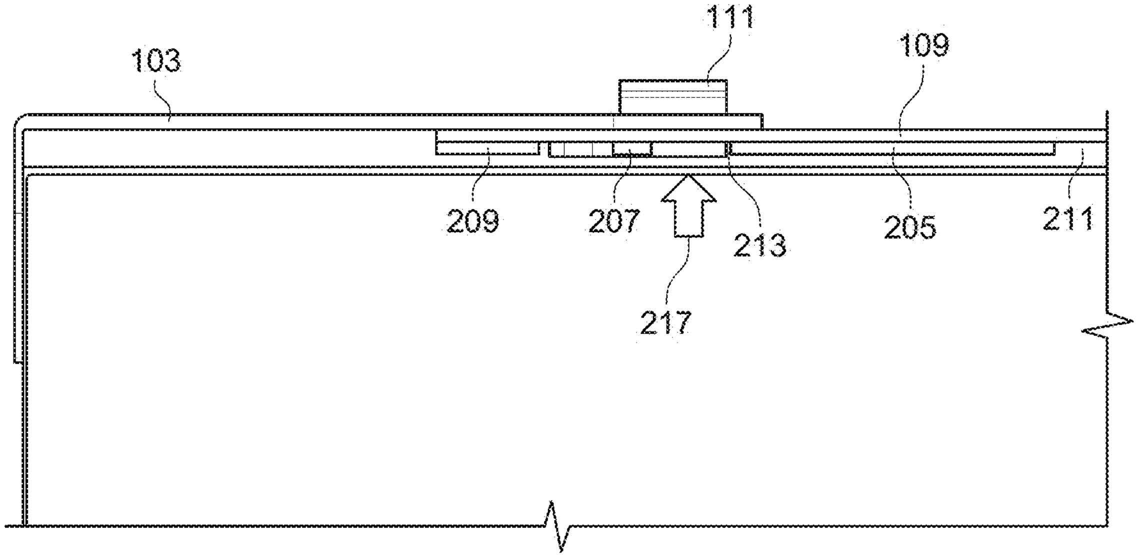
FIG. 5B is a left section view of the adjustable bracket shown in FIG. 5A, according to certain aspects of the present disclosure.
Figure 5C:
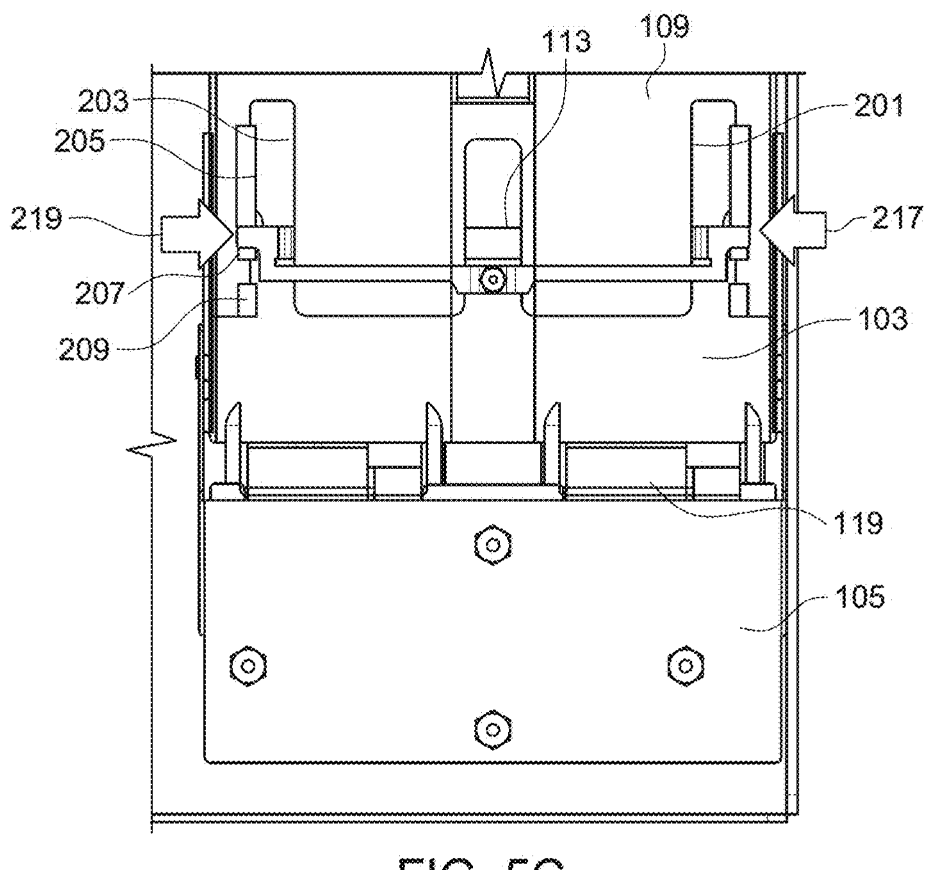
FIG. 5C is a bottom view of the adjustable bracket shown in FIG. 5A, according to certain aspects of the present disclosure.

FIGS. 5A, 5B, and 5C show an adjustable bracket 102 in an intermediately extended configuration, according to certain aspects of the present disclosure. Referring to FIG. 5A, the length of the adjustable bracket 102 in the intermediately extended configuration is Y that is less than X. In FIG. 5A, the empty internal space formed between the parallel side panels of the movable part 103 and the parallel side panels of the fixed part 109 to receive a PSU 120 is shown.

Referring to FIGS. 5B and 5C, the first and second protrusions 217, 219 of the handle 111 indicated by arrows engage with the second stop areas 213 by being positioned or locked between the first and second stoppers 205, 207. Thus, the adjustable bracket 102 is in the intermediately extended configuration and configured to receive a second-sized PSU 120 that is smaller or shorter than the first-sized PSU. The second-sized PSU 120 can be coupled to the power distribution board 107 by being plugged to the connector 119.

Figure 6A:
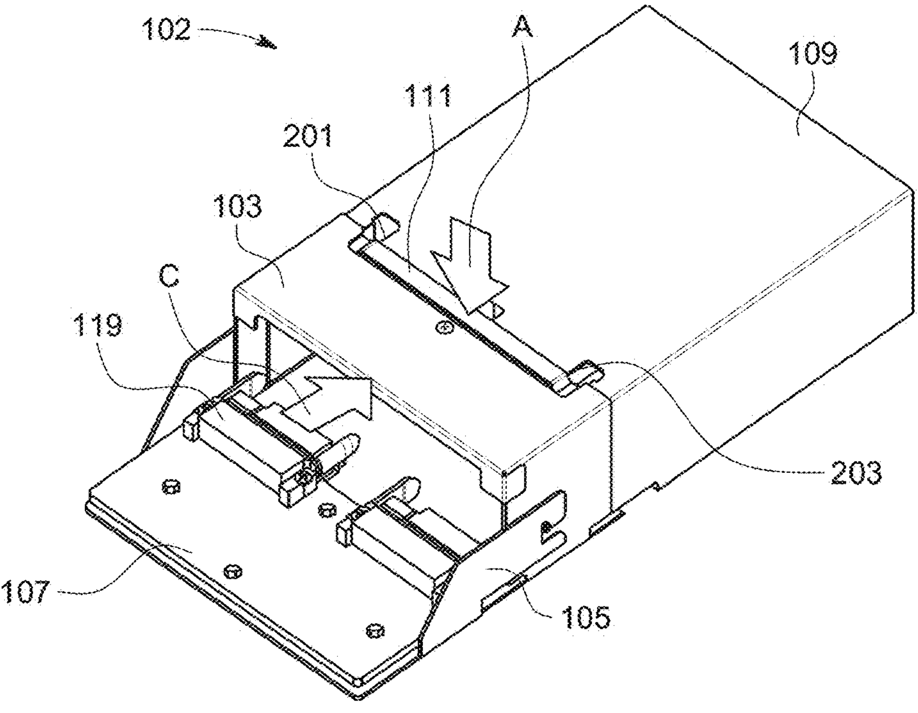
FIG. 6A is a perspective view of an adjustable bracket showing how to transition from an intermediately extended configuration to a compact configuration, according to certain aspects of the present disclosure.
Figure 6B:
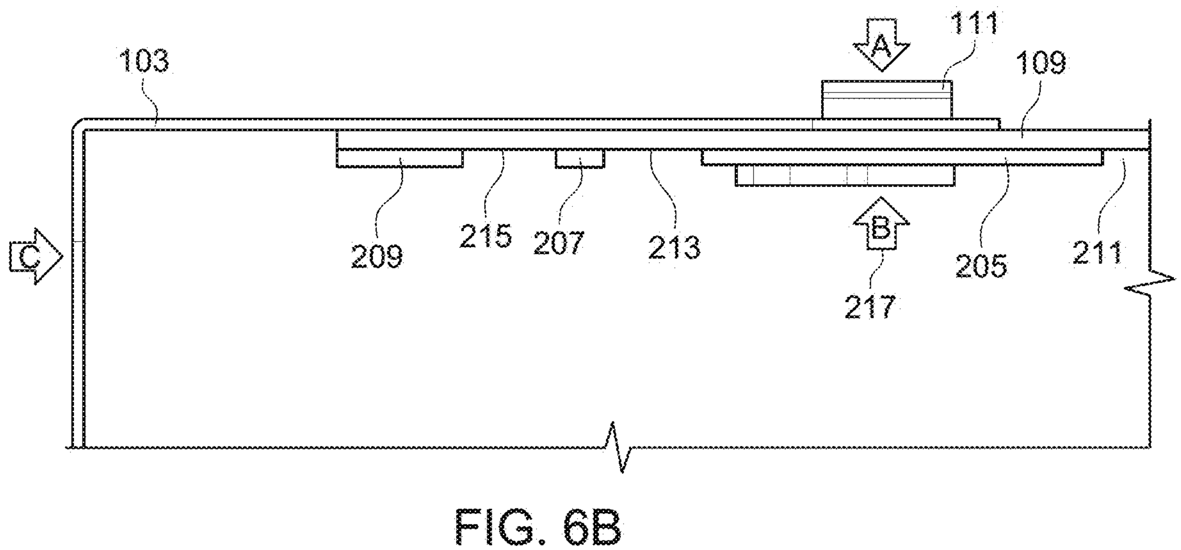
FIG. 6B is a left section view of the adjustable bracket shown in FIG. 6A, according to certain aspects of the present disclosure.
Figure 6C:
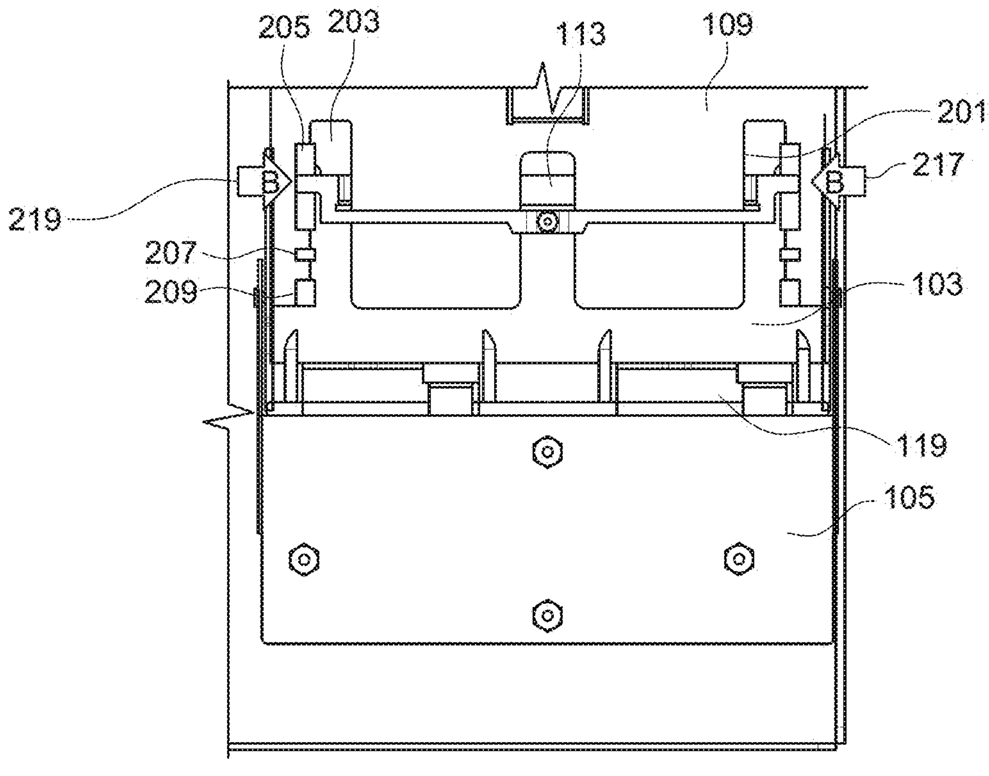
FIG. 6C is a bottom view of the adjustable bracket shown in FIG. 6A, according to certain aspects of the present disclosure.

FIGS. 6A, 6B, and 6C illustrate how to transition an adjustable bracket 102 in an intermediately extended configuration to a compact configuration, according to certain aspects of the present disclosure. Thus, the length Y of the adjustable bracket 102 in the intermediately extended configuration will be further reduced by the transitioning. Referring to FIGS. 6A, 6B, and 6C, in order to initiate the transitioning, the handle 111 or the upper part 113 is pressed down vertically or in the direction of arrow A. In response to pressing the handle 111 or the upper part 113, the first and second protrusions 217, 219 of the handle 111 are lowered than the stoppers 205, 207, 209. In particular, the first and second protrusions 217, 219 are positioned below the first stoppers 205, as indicated by arrow B. Subsequently, the movable part 103 is pushed horizontally in the direction of arrow C. In response to pushing the movable part 103, the handle 111 also moves horizontally, and the first and second protrusions 217, 219 will be eventually positioned at the first stop areas 211.

Figure 7A:
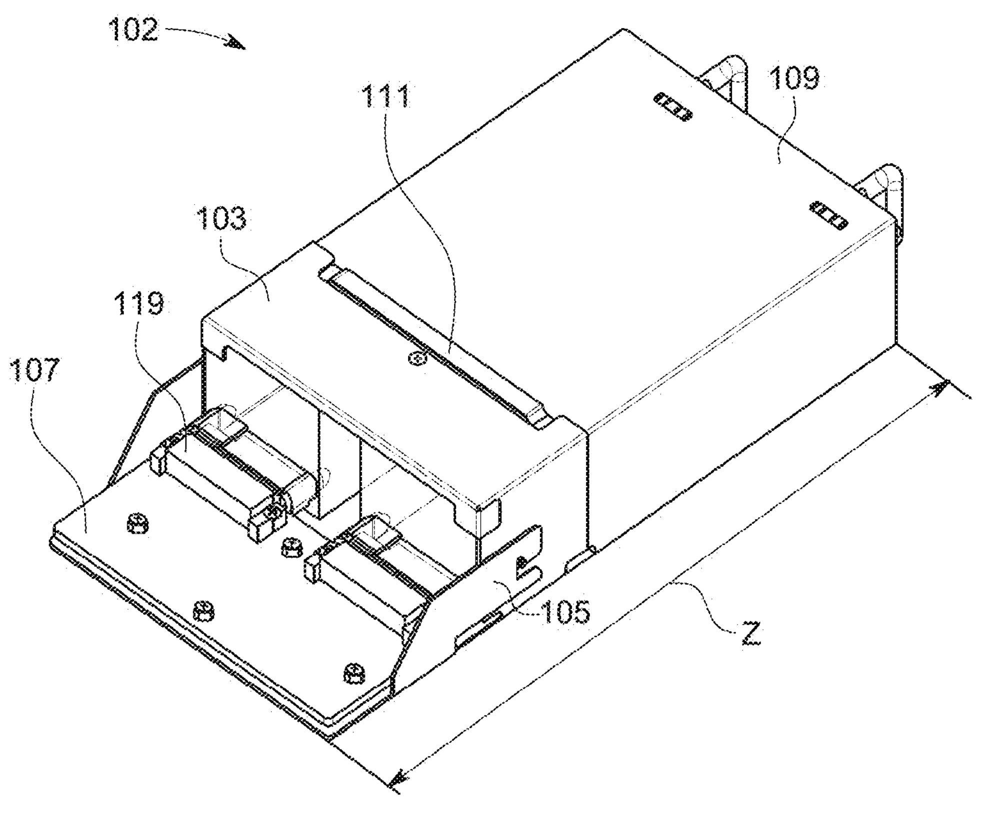
FIG. 7A is a perspective view of an adjustable bracket in a compact configuration, according to certain aspects of the present disclosure.
Figure 7B:
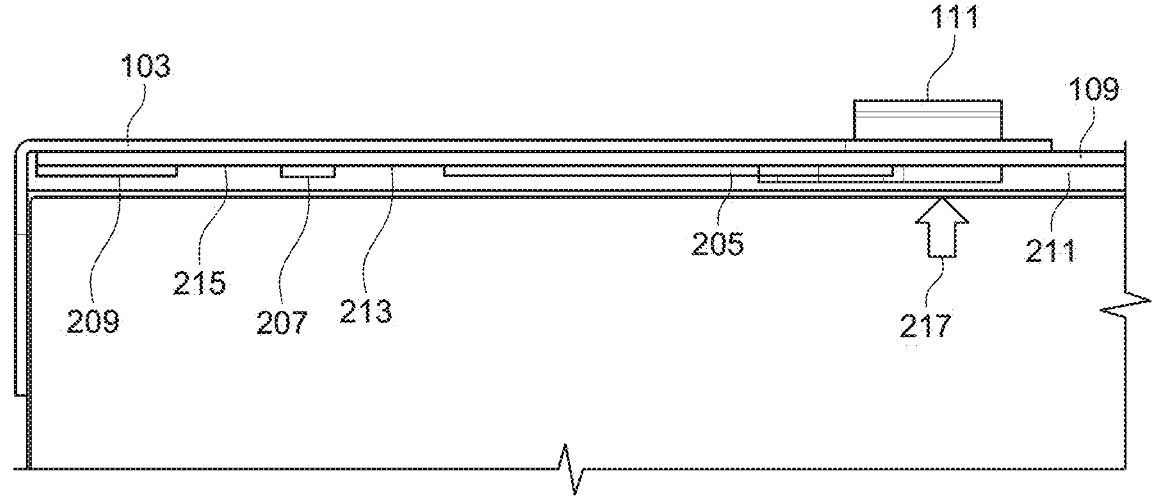
FIG. 7B is a left section view of the adjustable bracket shown in FIG. 7A, according to certain aspects of the present disclosure.
Figure 7C:
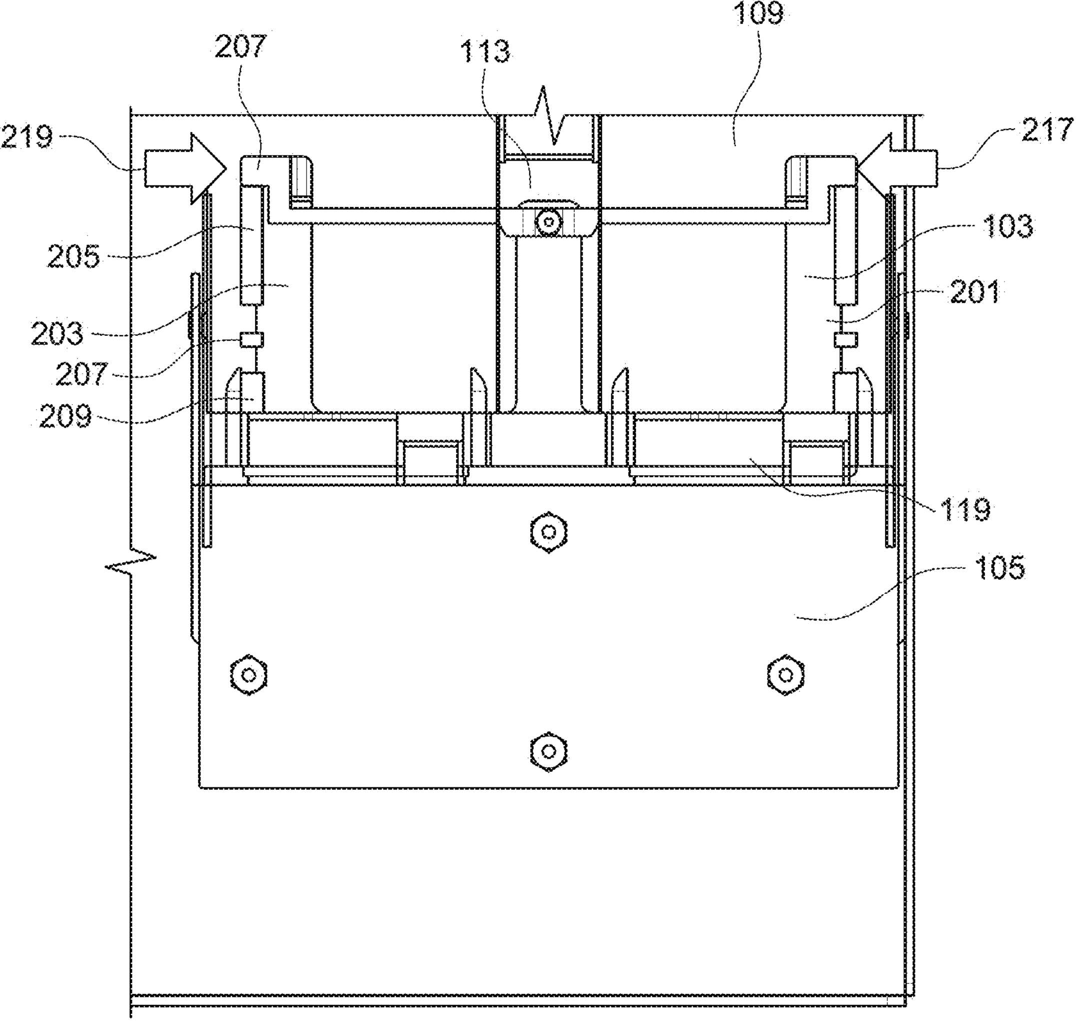
FIG. 7C is a bottom view of the adjustable bracket shown in FIG. 7A, according to certain aspects of the present disclosure.

FIGS. 7A, 7B, and 7C show an adjustable bracket 102 in a compact configuration, according to certain aspects of the present disclosure. In this case, the first and second slits 201, 203 formed on the fixed part 109 are not visible externally. Referring to FIG. 7A, the length of the adjustable bracket 102 in the compact configuration is Z that is less than Y. In FIG. 7A, the empty internal space is formed between the parallel side panels of the movable part 103 and the parallel side panels of the fixed part 109 to receive a PSU 120 is shown.

Referring to FIGS. 7B and 7C, the first and second protrusions 217, 219 of the handle 111 indicated by arrows are engaged with the first stop areas 211 by being positioned or locked between first ends of the first pair of stoppers 205 and first ends of the first and second slits 201, 203. Thus, the adjustable bracket 102 is in the compact configuration and configured to receive a third-sized PSU 120 that is smaller or shorter than the second-sized PSU. The third-sized PSU 120 can be coupled to the power distribution board 107 by being plugged to the connector 119.

As disclosed above, the adjustable bracket 102 can be adjusted to be in one of three different configurations, i.e., in a fully extended configuration, in an intermediately extended configuration, or in a compact configuration. The length of the adjustable bracket 102 is X in the fully extended configuration, Y in the intermediately extended configuration, or Z in the compact configuration. X is greater than Y, and Y is greater than Z. For example, X is within a range of 299 mm-319 mm, Y is within a range of 291 mm-311 mm, and Z is within a range of 262 mm-282 mm. In some embodiments, X is about 309 mm or 309 mm, Y is about 301 mm or 301 mm, and Z is about 272 mm or 272 mm. A first-sized PSU 120 is receivable within the adjustable bracket 102 in the fully extended configuration. A second-sized PSU 120 is receivable within the adjustable bracket 102 in the intermediately extended configuration. A third-sized PSU 120 is receivable within the adjustable bracket 102 in the compact configuration. The size or length of the first-sized PSU 120 is greater than the size or length of the second-sized PSU 120, and the size of length of the second-sized PSU 120 is greater than the size or length of the third-sized PSU 120.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A telecommunications system for electronic devices, the telecommunications system comprising:

a chassis for housing the electronic devices, the electronic devices including a power supply unit (PSU); and an adjustable bracket configured to enclose the PSU and mounted within the chassis, the adjustable bracket including:

a board bracket on which a power distribution board is mounted;

a movable part coupled to the board bracket;

a fixed part having a first slit that is generally parallel to a second slit; and a handle fixedly coupled to the movable part, the handle including an upper part, a first protrusion, and a second protrusion, the first protrusion extending from a first end of the upper part, the second protrusion extending from a second end of the upper part, the first protrusion being inserted through the first slit and the second protrusion being inserted through the second slit, wherein the movable part is movably coupled to the fixed part via the handle such that a distance between the handle and one end of the fixed part is adjustable according to a size of the PSU, the size being different for a first PSU than for a second PSU, and wherein, in response to pressing the upper part of the handle, the movable part is movable in a first direction or a second direction with respect to the fixed part;

wherein each of the movable part and the fixed part has a top panel and two parallel side panels that extend from side ends of the top panel, the two parallel side panels being generally perpendicular to the top panel such that an internal space is formed to receive the PSU, the internal space being between the parallel side panels of the movable part and the parallel side panels of the fixed part.

2. The telecommunications system of claim 1, wherein in response to pressing the upper part vertically, the movable part is allowed to move horizontally in the first or the second direction, the second direction being opposite the first direction.

3. The telecommunications system of claim 1, wherein the adjustable bracket further includes a connector configured to receive a connection interface of the PSU, the connector being positioned on the power distribution board.

4. The telecommunications system of claim 1, wherein the upper part of the handle is located in a raised vertical position relative to the first protrusion and the second protrusion, the first protrusion and the second protrusion being generally leveled along a lower vertical position.

5. The telecommunications system of claim 4, wherein the handle further includes a lower part, a first end portion of the lower part being coupled to the first protrusion, a second end portion of the lower part being coupled to the second protrusion.

6. The telecommunications system of claim 5, wherein the lower part is fixedly coupled to the movable part.

7. The telecommunications system of claim 6, wherein the lower part is coupled to the movable part by a fastener, the fastener passing through a hole formed at a middle portion of the lower part.

8. The telecommunications system of claim 7, wherein the fixed part further has a third slit that is generally parallel to the first slit and the second slit, the third slit being formed between the first and second slits.

9. The telecommunications system of claim 8, wherein the fastener is configured to move along the third slit when the movable part is moved in the first or second direction.

10. The telecommunications system of claim 5, wherein the upper part is exposed by being placed over an outer side of the fixed part, the lower part being placed under an inner side of the fixed part.

11. The telecommunications system of claim 1, wherein the adjustable bracket has a stopping mechanism to place the adjustable bracket in a compact configuration, in a fully extended configuration, or in an intermediately extended configuration.

12. The telecommunications system of claim 11, wherein:

the fixed part has an outer side on which the upper part of the handle is exposed, the fixed part further having an inner side facing an inner space of the adjustable bracket;

the stopping mechanism includes a first pair of stoppers formed on the inner side of the fixed part;

one stopper of the first pair of stoppers is formed along a length direction of the first slit, another stopper of the first pair of stoppers being formed along a length direction of the second slit;

the first and second slits are obscured by portions of the first pair of stoppers protruding inward with respect to the first and second slits, respectively, the protruding being relative to a view from the inner space of the adjustable bracket toward the inner side of the fixed part; and first stop areas are formed between first ends of the first pair of stoppers and first ends of the first and second slits.

13. The telecommunications system of claim 12, wherein:

the stopping mechanism further includes a second pair of stoppers formed on the inner side of the fixed part;

one stopper of the second pair of stoppers is formed along a length direction of the first slit, another stopper of the second pair of stoppers being formed along a length direction of the second slit;

the first and second slits are obscured by portions of the second pair of stoppers protruding inward with respect to the first and second slits, respectively, the protruding being relative to a view from the inner space of the adjustable bracket toward the inner side of the fixed part; and second stop areas are formed between second ends of the first pair of stoppers and first ends of the second pair of stoppers.

14. The telecommunications system of claim 13, wherein:

the stopping mechanism further includes a third pair of stoppers formed on the inner side of the fixed part;

one stopper of the third pair of stoppers is formed along a length direction of the first slit, another stopper of the second pair of stoppers being formed along a length direction of the second slit;

the first and second slits are obscured by portions of the third pair of stoppers protruding inward with respect to the first and second slits, respectively, the protruding being relative to a view from the inner space of the adjustable bracket toward the inner side of the fixed part; and third stop areas are formed between second ends of the second pair of stoppers and first ends of the third pair of stoppers.

15. The telecommunications system of claim 14, wherein each of the first and second protrusions is insertable into a corresponding one of the first, second, and third stop areas to place the adjustable bracket in the compact configuration, in the intermediately extended configuration, or in the fully extended configuration, respectively, by causing the first and second protrusions to engage with the first, second, or third stop areas, respectively.

16. The telecommunications system of claim 15, wherein:
- the first PSU is receivable by the adjustable bracket in the compact configuration, and the second PSU is receivable by the adjustable bracket in the fully extended configuration, the first PSU being smaller than the second PSU; and
- a third PSU is receivable by the adjustable bracket in the intermediately extended configuration, the third PSU being smaller than the second PSU and larger than the first PSU.

17. The telecommunications system of claim 14, wherein:
- lengths of the first pair of stoppers are greater than lengths of the second pair of stoppers;
- lengths of the first pair of stoppers are greater than lengths of the third pair of stoppers; and
- lengths of the third pair of stoppers are greater than lengths of the second pair of stoppers.

18. An adjustable bracket configured to enclose a power supply unit (PSU) for mounting within a chassis of an electronic equipment, the adjustable bracket comprising:
- a board bracket on which a power distribution board is mounted;
- a movable part coupled to the board bracket;
- a fixed part having a first slit that is generally parallel to a second slit; and
- a handle fixedly coupled to the movable part, the handle including an upper part, a first protrusion, and a second protrusion, the first protrusion extending from a first end of the upper part, the second protrusion extending from a second end of the upper part, the first protrusion being inserted through the first slit and the second protrusion being inserted through the second slit,
- wherein the movable part is movably coupled to the fixed part via the handle such that the adjustable bracket is adjustable to be placed in a compact configuration, in a fully extended configuration, or in an intermediately extended configuration, and
- wherein, in response to pressing the upper part of the handle, the movable part is movable in a first direction or a second direction with respect to the fixed part;
- wherein:
  - the adjustable bracket has a stopping mechanism to place the adjustable bracket in the compact configuration, in the fully extended configuration, or in the intermediately extended configuration;
  - the stopping mechanism includes a first pair of stoppers, a second pair of stoppers, and a third pair of stoppers formed on an inner side of the fixed part;
  - one stopper of each of the first, second, and third pairs of stoppers is formed along a length direction of the first slit, another stopper of each of the first, second, and third pairs of stoppers being formed along a length direction of the second slit;
  - portions of the first and second slits are obscured by portions of each of the first, second, and third pairs of stoppers protruding inward with respect to the first and second slits, respectively, the protruding being relative to a view from an inner space of the adjustable bracket toward the inner side of the fixed part;
  - first stop areas are formed between first ends of the first pair of stoppers and first ends of the first and second slits;
  - second stop areas are formed between second ends of the first pair of stoppers and first ends of the second pair of stoppers;
  - third stop areas are formed between second ends of the second pair of stoppers and first ends of the third pair of stoppers; and
  - each of the first and second protrusions is insertable into a corresponding one of the first, second, and third stop areas to place the adjustable bracket in the compact configuration, in the intermediately extended configuration, or in the fully extended configuration, respectively, by causing the first and second protrusions to engage with the first, second, or third stop areas, respectively.

19. A telecommunications system for electronic devices, the telecommunications system comprising:
- a chassis for housing the electronic devices, the electronic devices including a power supply unit (PSU); and
- an adjustable bracket configured to enclose the PSU and mounted within the chassis, the adjustable bracket including:
  - a board bracket on which a power distribution board is mounted;
  - a movable part coupled to the board bracket;
  - a fixed part having a first slit that is generally parallel to a second slit; and
  - a handle fixedly coupled to the movable part, the handle including an upper part, a first protrusion, and a second protrusion, the first protrusion extending from a first end of the upper part, the second protrusion extending from a second end of the upper part, the first protrusion being inserted through the first slit and the second protrusion being inserted through the second slit;
- wherein the movable part is movably coupled to the fixed part via the handle such that a distance between the handle and one end of the fixed part is adjustable according to a size of the PSU, the size being different for a first PSU than for a second PSU;
- wherein, in response to pressing the upper part of the handle, the movable part is movable in a first direction or a second direction with respect to the fixed part;
- wherein the upper part of the handle is located in a raised vertical position relative to the first protrusion and the second protrusion, the first protrusion and the second protrusion being generally leveled along a lower vertical position;
- wherein the handle further includes a lower part, a first end portion of the lower part being coupled to the first protrusion, a second end portion of the lower part being coupled to the second protrusion;
- wherein the lower part is fixedly coupled to the movable part; and
- wherein the lower part is coupled to the movable part by a fastener, the fastener passing through a hole formed at a middle portion of the lower part.

20. The telecommunications system of claim 19, wherein the fixed part further has a third slit that is generally parallel to the first slit and the second slit, the third slit being formed between the first and second slits.

21. The telecommunications system of claim 20, wherein the fastener is configured to move along the third slit when the movable part is moved in the first or second direction.

22. The telecommunications system of claim 21, wherein the upper part is exposed by being placed over an outer side of the fixed part, the lower part being placed under an inner side of the fixed part.

23. A telecommunications system for electronic devices, the telecommunications system comprising:

a chassis for housing the electronic devices, the electronic devices including a power supply unit (PSU); and an adjustable bracket configured to enclose the PSU and mounted within the chassis, the adjustable bracket including:

a board bracket on which a power distribution board is mounted;

a movable part coupled to the board bracket;

a fixed part having a first slit that is generally parallel to a second slit; and a handle fixedly coupled to the movable part, the handle including an upper part, a first protrusion, and a second protrusion, the first protrusion extending from a first end of the upper part, the second protrusion extending from a second end of the upper part, the first protrusion being inserted through the first slit and the second protrusion being inserted through the second slit, wherein the movable part is movably coupled to the fixed part via the handle such that a distance between the handle and one end of the fixed part is adjustable according to a size of the PSU, the size being different for a first PSU than for a second PSU, wherein, in response to pressing the upper part of the handle, the movable part is movable in a first direction or a second direction with respect to the fixed part; and wherein the adjustable bracket has a stopping mechanism to place the adjustable bracket in a compact configuration, in a fully extended configuration, or in an intermediately extended configuration;

wherein:

the fixed part has an outer side on which the upper part of the handle is exposed, the fixed part further having an inner side facing an inner space of the adjustable bracket, the stopping mechanism includes a first pair of stoppers formed on the inner side of the fixed part, one stopper of the first pair of stoppers is formed along a length direction of the first slit, another stopper of the first pair of stoppers being formed along a length direction of the second slit, the first and second slits are obscured by portions of the first pair of stoppers protruding inward with respect to the first and second slits, respectively, the protruding being relative to a view from the inner space of the adjustable bracket toward the inner side of the fixed part, and first stop areas are formed between first ends of the first pair of stoppers and first ends of the first and second slits.

24. The telecommunications system of claim 23, wherein:

the stopping mechanism further includes a second pair of stoppers formed on the inner side of the fixed part;

one stopper of the second pair of stoppers is formed along a length direction of the first slit, another stopper of the second pair of stoppers being formed along a length direction of the second slit;

the first and second slits are obscured by portions of the second pair of stoppers protruding inward with respect to the first and second slits, respectively, the protruding being relative to a view from the inner space of the adjustable bracket toward the inner side of the fixed part; and second stop areas are formed between second ends of the first pair of stoppers and first ends of the second pair of stoppers.

25. The telecommunications system of claim 24, wherein:

the stopping mechanism further includes a third pair of stoppers formed on the inner side of the fixed part;

one stopper of the third pair of stoppers is formed along a length direction of the first slit, another stopper of the second pair of stoppers being formed along a length direction of the second slit;

the first and second slits are obscured by portions of the third pair of stoppers protruding inward with respect to the first and second slits, respectively, the protruding being relative to a view from the inner space of the adjustable bracket toward the inner side of the fixed part; and third stop areas are formed between second ends of the second pair of stoppers and first ends of the third pair of stoppers.

26. The telecommunications system of claim 25, wherein each of the first and second protrusions is insertable into a corresponding one of the first, second, and third stop areas to place the adjustable bracket in the compact configuration, in the intermediately extended configuration, or in the fully extended configuration, respectively, by causing the first and second protrusions to engage with the first, second, or third stop areas, respectively.

27. The telecommunications system of claim 26, wherein:

the first PSU is receivable by the adjustable bracket in the compact configuration, and the second PSU is receivable by the adjustable bracket in the fully extended configuration, the first PSU being smaller than the second PSU; and a third PSU is receivable by the adjustable bracket in the intermediately extended configuration, the third PSU being smaller than the second PSU and larger than the first PSU.

28. The telecommunications system of claim 25, wherein:

lengths of the first pair of stoppers are greater than lengths of the second pair of stoppers;

lengths of the first pair of stoppers are greater than lengths of the third pair of stoppers; and lengths of the third pair of stoppers are greater than lengths of the second pair of stoppers.

29. A telecommunications system for electronic devices, the telecommunications system comprising:

a chassis for housing the electronic devices in a chassis interior space, the electronic devices including a power supply unit (PSU); and an adjustable bracket configured to enclose the PSU and mounted within the chassis, the adjustable bracket including:

a board bracket on which a power distribution board is mounted;

a movable part coupled to the board bracket;

a fixed part positioned in a nonoverlapping manner with and adjacent to the movable part, the fixed part having a first slit that is generally parallel to a second slit; and a handle fixedly coupled to the movable part, the handle including an upper part, a first protrusion, and a second protrusion, the first protrusion extending from a first end of the upper part, the second protrusion extending from a second end of the upper part, the first protrusion being inserted through the first slit and the second protrusion being inserted through the second slit, the upper part extending away from the chassis interior space and free of the fixed part for user access;

wherein the movable part is movably coupled to the fixed part via the handle such that a distance between the handle and one end of the fixed part is adjustable according to a size of the PSU, the size being different for a first PSU than for a second PSU, and wherein, in response to pressing the upper part of the handle, the movable part is movable in a first direction or a second direction with respect to the fixed part.

* * * * *